United States Patent
Hiyama et al.

(10) Patent No.: US 7,812,873 B2
(45) Date of Patent: Oct. 12, 2010

(54) IMAGE PICKUP DEVICE AND IMAGE PICKUP SYSTEM

(75) Inventors: Hiroki Hiyama, Zama (JP); Masanori Ogura, Atsugi (JP); Seiichiro Sakai, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1077 days.

(21) Appl. No.: 11/212,676

(22) Filed: Aug. 29, 2005

(65) Prior Publication Data

US 2006/0044439 A1 Mar. 2, 2006

(30) Foreign Application Priority Data

Sep. 1, 2004 (JP) ............................. 2004-254357

(51) Int. Cl.
*H04N 5/335* (2006.01)
*H04N 3/14* (2006.01)

(52) U.S. Cl. ...................... 348/294; 348/308; 348/302; 257/431; 257/450

(58) Field of Classification Search ................ 348/308, 348/294, 302; 257/431, 450
See application file for complete search history.

(56) References Cited

U.S. PATENT DOCUMENTS

| | | | | |
|---|---|---|---|---|
| 4,663,669 A | 5/1987 | Kinoshita et al. | ...... | 358/213.19 |
| 4,774,585 A | 9/1988 | Suga et al. | ............. | 358/213.19 |
| 4,780,764 A | 10/1988 | Kinoshita et al. | ...... | 358/213.19 |
| 4,821,105 A | 4/1989 | Suga et al. | ............. | 358/213.19 |
| 5,121,225 A | 6/1992 | Murata et al. | ................ | 358/471 |
| 5,261,013 A | 11/1993 | Murata et al. | .................. | 382/65 |
| 5,475,211 A | 12/1995 | Ogura et al. | ............. | 250/208.1 |
| 5,955,753 A | 9/1999 | Takahashi | .................... | 257/292 |
| 6,040,592 A * | 3/2000 | McDaniel et al. | ........... | 257/292 |
| 6,188,094 B1 | 2/2001 | Kochi et al. | .................. | 257/232 |
| 6,605,850 B1 | 8/2003 | Kochi et al. | .................. | 257/431 |
| 6,657,665 B1 | 12/2003 | Guidash | ..................... | 348/308 |
| 6,670,990 B1 | 12/2003 | Kochi et al. | .................. | 348/310 |
| 6,801,253 B1 | 10/2004 | Yonemoto et al. | ........... | 348/241 |
| 6,946,637 B2 | 9/2005 | Kochi et al. | .............. | 250/208.1 |
| 6,960,751 B2 | 11/2005 | Hiyama et al. | ........... | 250/208.1 |
| 7,110,030 B1 | 9/2006 | Kochi et al. | .................. | 348/308 |

(Continued)

FOREIGN PATENT DOCUMENTS

EP 1 017 106 A2 7/2000

(Continued)

OTHER PUBLICATIONS

Chapman et al., Creating 35 mm Camera Active Pixel Sensors, Proceedings of IEEE International Symposium on Defect and Fault Tolerance in VLSI Systems, Nov. 1999, pp. 22-30.*

*Primary Examiner*—David L Ometz
*Assistant Examiner*—Antoinette T Spinks
(74) *Attorney, Agent, or Firm*—Fitzpatrick, Cella, Harper & Scinto (57) ABSTRACT

Unit cells each having a plurality of photodiodes 101a and 101b, a plurality of transfer MOSFETs 102a and 102b provided in correspondence to the plurality of photodiodes, respectively and a common amplifying MOSFET 104 for amplifying and outputting signals read out from the plurality of diodes are arranged two-dimensionally, and, plural photodiodes are disposed around the photodiode 101b and trapping regions 130, 134, 135 and 132 are for trapping excessive carriers from the photodiode 101b are provided between the photodiode 101b and the plural photodiodes, respectively.

11 Claims, 11 Drawing Sheets

U.S. PATENT DOCUMENTS

| | | | |
|---|---|---|---|
| 2003/0164887 A1 | 9/2003 | Koizumi et al. | 348/308 |
| 2004/0000681 A1* | 1/2004 | Shinohara et al. | 257/290 |
| 2005/0098805 A1 | 5/2005 | Okita et al. | 257/292 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0043393 A1 | 3/2006 | Okita et al. | 257/93 |
| 2006/0043440 A1 | 3/2006 | Hiyama et al. | 257/291 |
| 2006/0044434 A1 | 3/2006 | Okita et al. | 348/294 |
| 2006/0157759 A1* | 7/2006 | Okita et al. | 257/292 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |
| 2007/0085110 A1* | 4/2007 | Okita et al. | 257/239 |

FOREIGN PATENT DOCUMENTS

| | | |
|---|---|---|
| JP | 9-46596 | 2/1997 |
| JP | 11-122532 | 4/1999 |
| JP | 2000-77344 | 3/2000 |
| JP | 2000-232216 | 8/2000 |

* cited by examiner

FIG. 1

| METAL WIRING LAYER | | ACTIVE REGION |
| POLYSILICON LAYER | | ⊠ CONTACT HOLE |

ODD NUMBER ROW

FIG. 6

ODD NUMBER ROW

| Gb | B | Gb | B |
|----|---|----|---|
| R | Gr | R | Gr |
| Gb | B | Gb | B |
| R | Gr | R | Gr |

IMAGE PICKUP DEVICE AND IMAGE PICKUP SYSTEM

BACKGROUND OF THE INVENTION

1. Field of the Invention

The present invention relates to an image pickup device and an image pickup system, and more particularly, it relates to an image pickup device and an image pickup system, in which unit cells each comprising a plurality of photoelectric conversion regions, a plurality of transfer switch means provided in correspondence to the respective photoelectric conversion regions, and common amplifying means for amplifying photocarriers read from the plurality of photoelectric conversion regions as an input are arranged in a matrix pattern.

2. Related Background Art

In recent years, an image pickup device called as a CMOS sensor using a CMOS process has been paid attention to. The CMOS sensor has particularly been applied to a field of portable information equipments for the reasons that peripheral circuits can easily be mixed and driving can be performed with low voltage.

Figure 14:
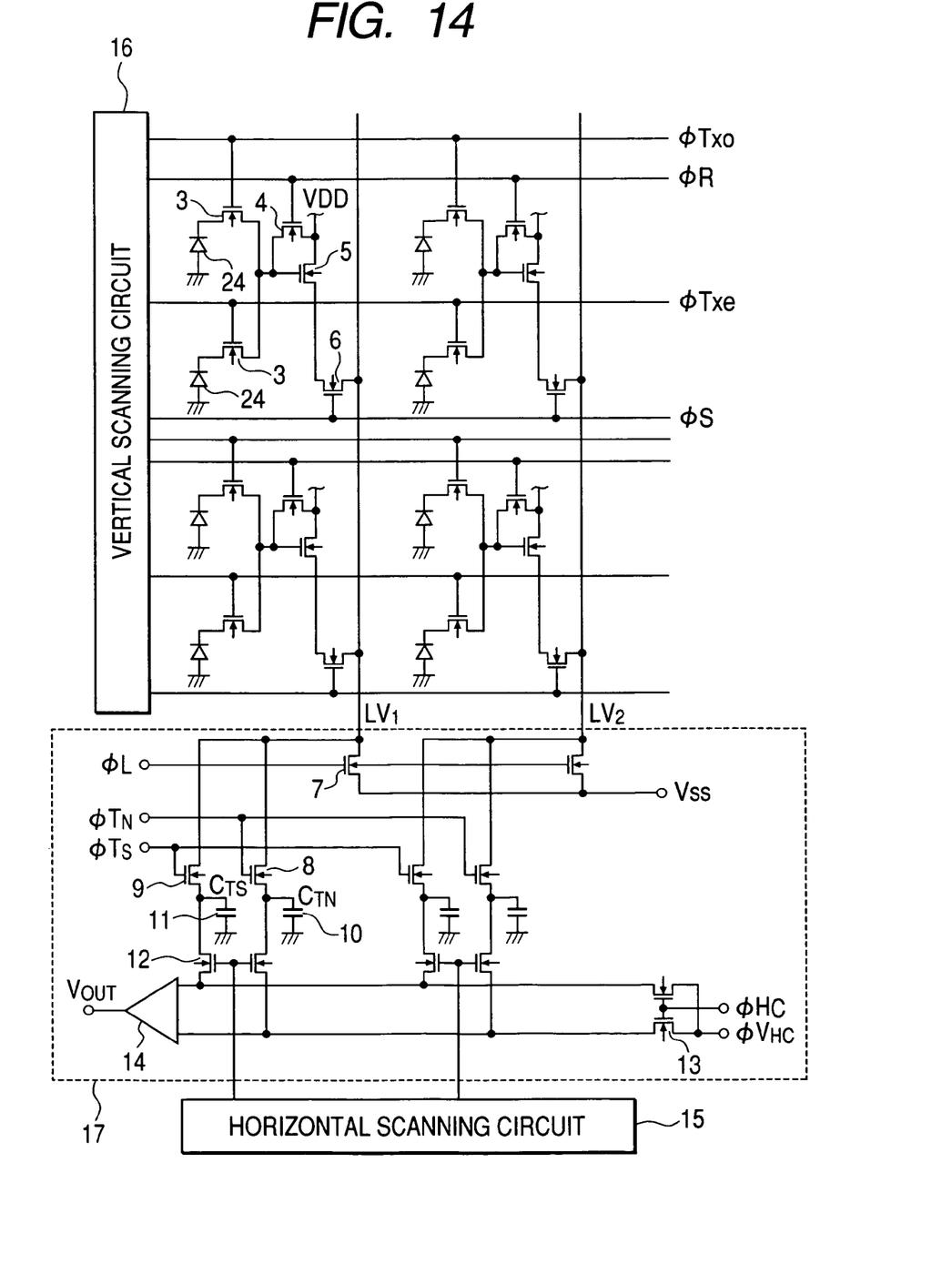
FIG. 14 is a view showing an equivalent circuit of a conventional image pickup device.

As a pixel arrangement of the CMOS sensor having a high S/N ratio, for example, as disclosed in Japanese Patent Application Laid-Open No. H11-122532 (1999), a pixel arrangement in which a transfer switch is provided between a photodiode and a pixel amplifier is known. However, a disadvantage of this arrangement is that, since the number of transistors is great, if the dimension of the pixel is reduced, it is difficult to leave an adequate area for the photodiode due to the existence of a substantial area required for the transistors. In order to eliminate this disadvantage, in recent years, for example, as disclosed in Japanese Patent Application Laid-Open No. H09-046596 (1997) (corresponding to U.S. Pat. No. 5,955,753), a technique in which the plurality of adjacent pixels hold the same transistor in common has been proposed. Such a conventional image pickup device is shown in FIG. 14 (same as FIG. 8 in the above patent document). In FIG. 14, the reference numeral 3 designates a transfer MOS transistor acting as a transfer switch; 4 designates a reset MOS transistor for supplying reset potential; and 5 designates a source follower amplifier MOS transistor. The reference numeral 6 designates a horizontal election MOS transistor for causing the source follower amplifier MOS transistor 5 to output a signal therefrom selectively; and 7 designates a load MOS transistor of the source follower. The reference numeral 8 designates a dark output transfer MOS transistor for transferring a dark output signal; and 9 designates a bright output transfer MOS transistor for transferring a bright output signal. The reference numeral 10 designates a dark output accumulating capacity CTN for accumulating the dark output signal; and 11 designates a bright output accumulating capacity CTS for accumulating the bright output signal. The reference numeral 12 designates a horizontal transfer MOS transistor for transferring the dark output signal and the bright output signal to a horizontal output line; and 13 designates a horizontal output line resetting MOS transistor for resetting the horizontal output line; 14 designates a differential output amplifier; 15 designates a horizontal scanning circuit; 16 designates a vertical scanning circuit; and 24 designates a pinned photodiode. Here, the dark output signal means a signal generated by resetting a gate region of the source follower amplifier MOS transistor 5 and the bright output signal means a signal obtained by adding a signal photo-electrically converted by the photodiode 24 to the dark output signal. A signal reducing dispersion in the source follower amplifier MOS transistors 5 is obtained from the differential output amplifier.

As can be seen from the above Figure, one source follower amplifier 5 is connected to two vertical photodiodes 24 via the transfer MOS transistors 3. Accordingly, although eight MOS transistors were required for two pixels in the prior art, since only five MOS transistors are used in this arrangement, it is advantageous for miniaturization. By holding the transistor in common, the number of the transistors per each pixel is reduced, thereby preserving an adequate area for the photodiode.

Further, as an example of the pixel layout having the common transistor arrangement, there is an arrangement disclosed in Japanese Patent Application Laid-Open No. 2000-232216 (corresponding to EP 1017106A).

As mentioned above, although the common transistor arrangement can effectively contribute to the reduction of the pixel, the Inventors found that, in the CMOS sensor having the common transistor arrangement, an aliasing called as blooming is apt to be generated, so that image quality is deteriorated considerably, particularly under a high luminance condition.

SUMMARY OF THE INVENTION

An object of the present invention is to prevent blooming in an image pickup device having a common transistor arrangement.

Consideration of the Inventors regarding the fact that the blooming is apt to be generated in the image pickup device having the common transistor arrangement is as follows:

As an example of the pixel layout in the image pickup device having the common transistor arrangement, there is the arrangement disclosed in the above-mentioned Japanese Patent Application Laid-Open No. 2000-232216. However, since the number of the transistors per each pixel is reduced, there are two directions: that is to say, a direction in which the transistor is interposed between the photodiodes and there is an N type source drain diffusion region, and a direction in which there is no transistor between the photodiode and there is no N type source drain region.

If any one photodiode is saturated, over flow charges or carriers will be diffused around from such a photodiode. If the diffused carriers reach the N type source drain region, they are trapped therein and are discharged to a power source ultimately. However, if there is no source drain region in the diffusion direction, the carriers are not trapped at all and thus flow into the adjacent photodiode, thereby generating an aliasing called as blooming. For this reason, in the conventional pixel layout having the common transistor arrangement disclosed in the above-mentioned Japanese Patent Application Laid-Open No. 2000-232216, the blooming is generated between the adjacent photodiodes.

The present invention is made on the basis of the above-mentioned consideration. In a solid image pickup device according to the present invention, unit cells each comprising a plurality of photoelectric conversion regions, a plurality of transfer switch means provided in correspondence to the plurality of photoelectric conversion regions, respectively, and common amplifying means for amplifying photocarriers read from the plurality of photoelectric conversion regions as an input are arranged two-dimensionally, and the improvement is that plural photoelectric conversion regions are disposed adjacent to and around one photoelectric conversion region and semiconductor diffusion regions capable of trapping over flow carriers from the one photoelectric conversion region is provided between the one photoelectric conversion region and the plural photoelectric conversion regions, respectively.

Other features and advantages of the present invention will be apparent from the following description taken in conjunction with the accompanying drawings, in which like reference characters designates the same or similar parts throughout the figures thereof.

DESCRIPTION OF THE PREFERRED EMBODIMENTS

The accompanying drawings, which are incorporated in and constitute a part of the specification, illustrate embodiments of the invention and, together with the description, serve to explain the principles of the invention.

Now, embodiments of the present invention will be explained.

First Embodiment

Figure 1:
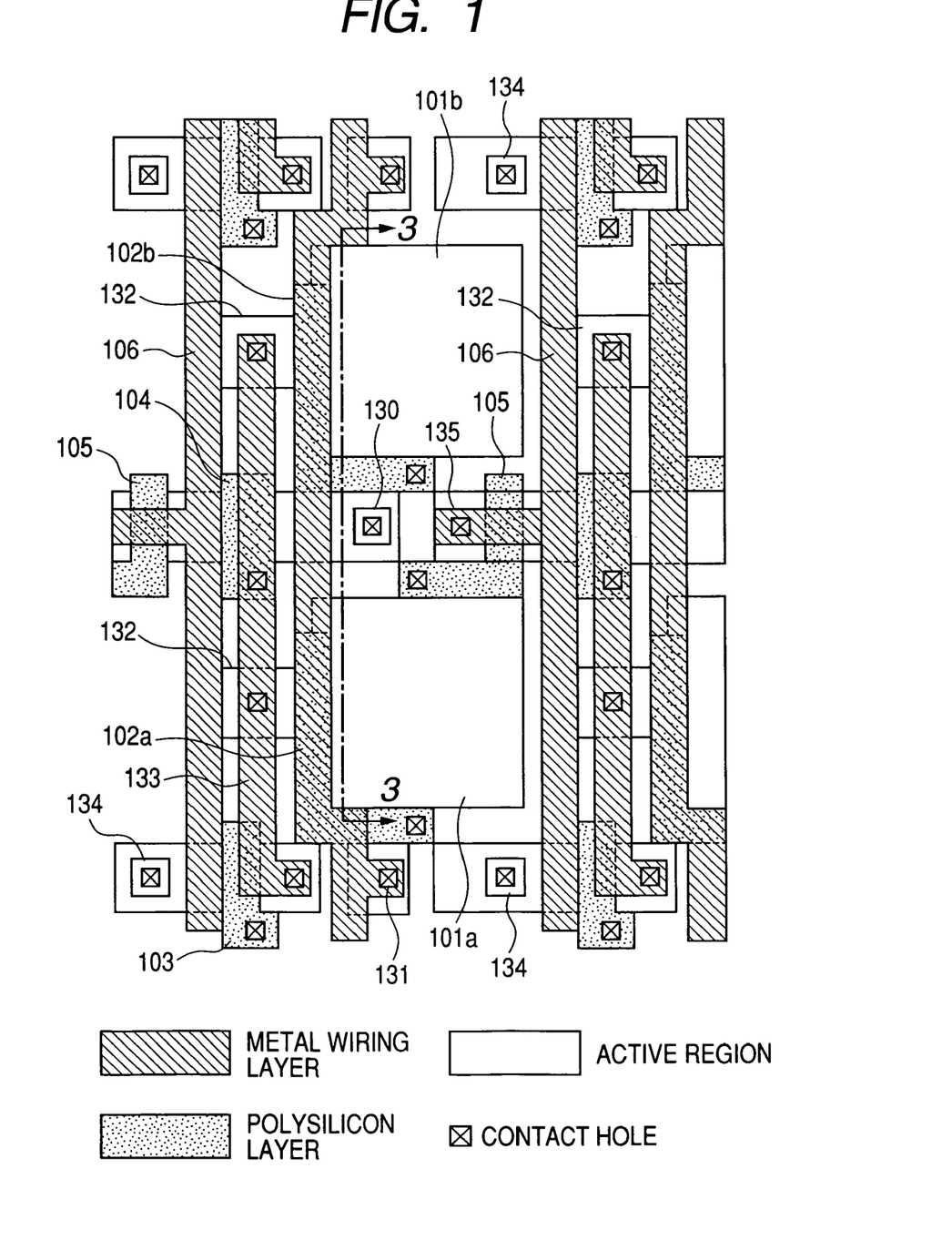
FIG. 1 is a plan view showing a layout of unit cells in an image pickup device according to a first embodiment of the present invention.
Figure 2:
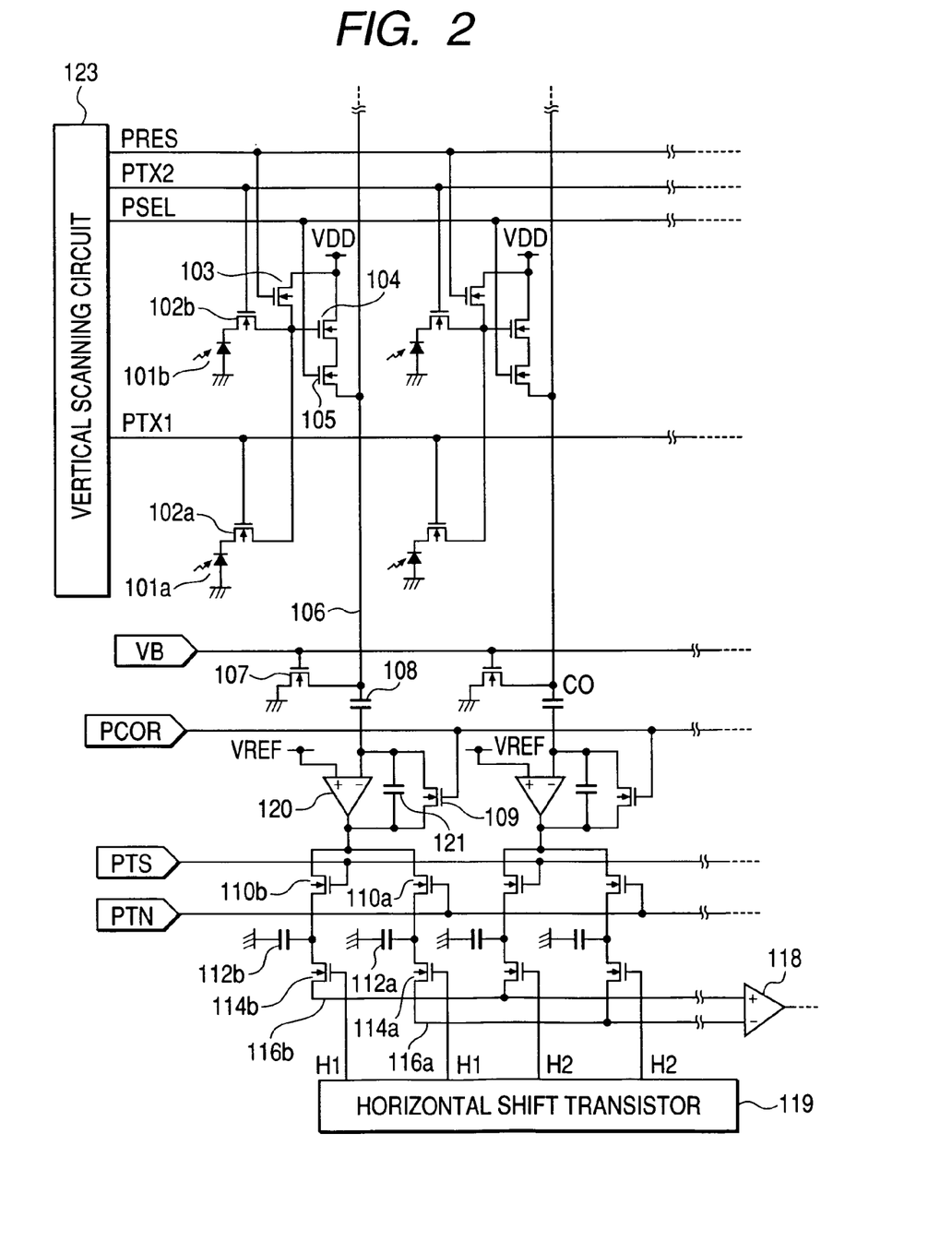
FIG. 2 is a view showing an equivalent circuit of the image pickup device according to the first embodiment of the present invention.

Here, an image pickup device according to a first embodiment of the present invention will be described. FIG. 1 is a plan view showing unit cells in a solid image pickup device according to a first embodiment. FIG. 2 is a view showing an equivalent circuit of the image pickup device according to this embodiment, in which pixels having a layout shown in FIG. 1 are arranged in two-dimensional pattern (matrix pattern). It is not necessary that the pixels are arranged in the matrix pattern strictly, but, for example, the pixels may be arranged in a honeycomb pattern (see Japanese Patent Application Laid-Open No. 2000-077344).

In FIG. 2, each unit cell includes photodiodes 101a and 101b as photoelectric conversion elements, an amplifying MOSFET 104 as a common amplifying means for amplifying signals generated by the photodiodes 101a and 101b, and a reset MOSFET 103 as a common reset switch for resetting an input of the amplifying MOSFET 104 to predetermined voltage. In addition, a row election MOSFET 105 as a common row election switch for controlling electrical communication between a source electrode of the amplifying MOSFET 104 and a vertical output line 106 is also provided. Further, transfer MOSFETs 102a and 102b are provided in correspondence to the photodiodes 101a and 101b, respectively. Here, since two photodiodes are formed in the unit cell, the unit cell includes two pixels. Incidentally, in FIG. 1, 101a and 101b are diffusion regions of the photodiodes provided in P well (the P well and the N type diffusion region constitute a PN junction). The reference numeral 104 designates a gate electrode of the amplifying MOSFET; 103 designates a gate electrode of the reset MOSFET; 105 designates a gate electrode of the row election MOSFET; and 102a and 102b designate gate electrodes of pixel transfer MOSFETs. Further, the reference numeral 130 designates an N type impurity region connected to a power source (VDD); 131 designates a grounded P type impurity region; 134 designates a drain region of the reset MOSFET; and 135 designates an N type diffusion region connected to the vertical output line 106.

Carriers accumulated in the photodiodes 101a and 101b are transferred to floating diffusion regions (FD regions) 132 via the pixel transfer MOSFETs 102a and 102b. These FD regions 132 are connected, in common, to the gate electrode of the amplifying MOSFET 104 and the source electrode of the reset MOSFET 103 via a wiring (conductor) 133.

Figure 3:
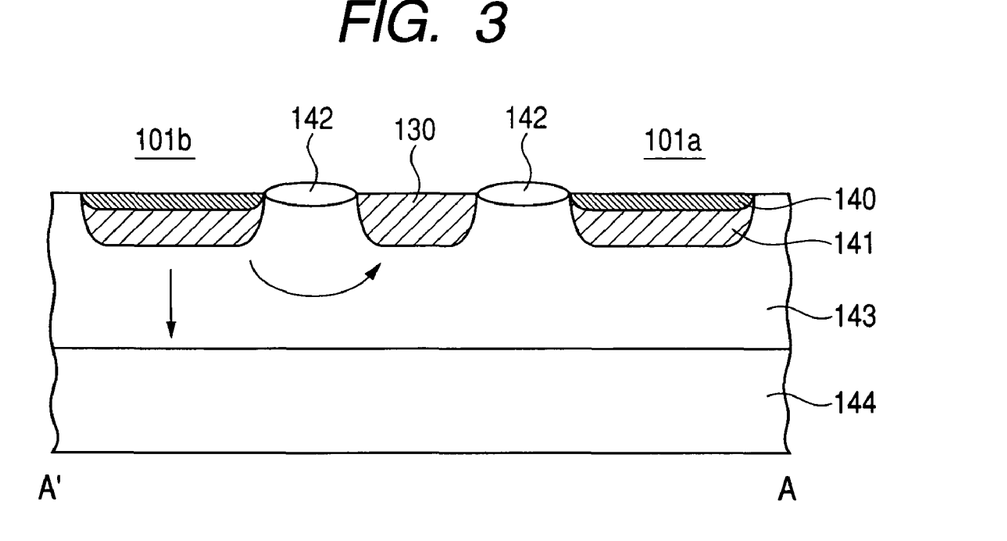
FIG. 3 is a sectional view of the image pickup device according to the first embodiment of the present invention, taken along the line 3-3 in FIG. 1.

In order to explain the effect for reducing blooming in this embodiment, a sectional view taken along the line 3-3 in FIG. 1 is shown in FIG. 3. The photodiodes 101a and 101b include a PN junction constituted by an N type diffusion region 141 and a P type well 143. Further, a PN junction is constituted by a dense P type diffusion region 140 and an N type diffusion region 141 at a front surface side of a semiconductor substrate, thereby forming a pinned photodiode wholly. An N type diffusion region 130 connected to the power source (VDD) is disposed between the photodiode 101a and the photodiode 101b, which region serves, at the same time, to a drain region of the amplifying MOSFET 104. The photodiodes 101a, 101b and the N type diffusion region 130 are separated from each other by an element separating oxidized film 142 such as a LOCOS film. Incidentally, in FIG. 3, a polysilicon layer is omitted from illustration for the simplicity's sake. Further, an underlying layer disposed below the P type well 143 constitutes an N type semiconductor substrate 144 connected to the power source. When the photodiode 101b is saturated, as shown by the arrows in FIG. 3, over flow carriers (electrons in this case) are diffused out of the photodiode 101b. In this case, electrons diffused to the right in FIG. 3 (electrons diffused from the photodiode 101b to the N type diffusion region 130) are trapped by the N type diffusion layer 130 (impurity diffusion region of conductive type same as the photocarrier) of the drain region of the amplifying MOSFET 104. Thus, the over flow electrons are not diffused onto the photodiode 101a. Further, electrons diffused downward in FIG. 3 are trapped by the N type substrate 144.

Figure 4:
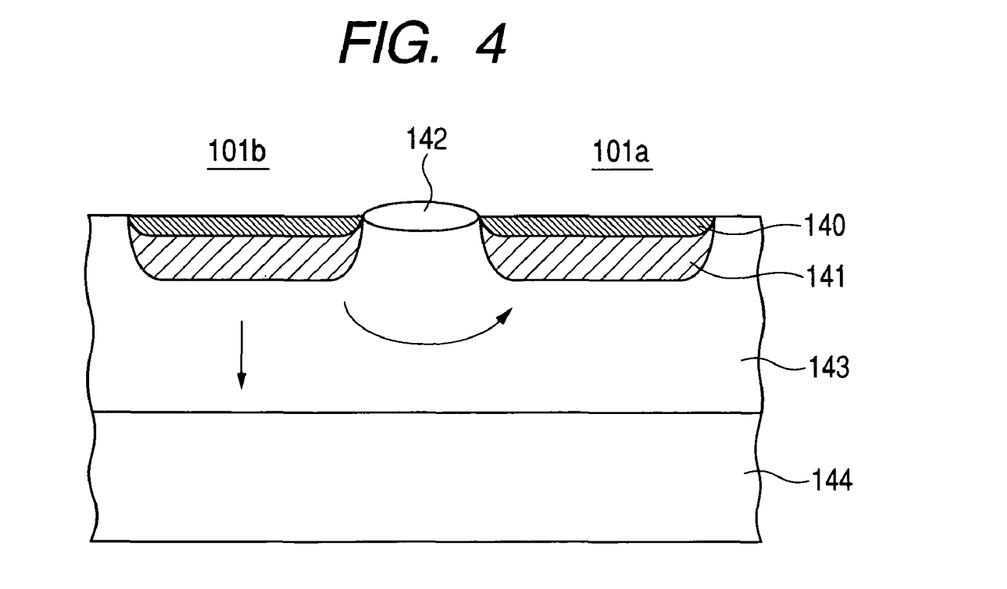
FIG. 4 is a sectional view of the image pickup device in which there is no region for trapping electrons.

Here, an image pickup device having an arrangement in which there is no N type diffusion region 130 and the photodiodes 101a and 101b are adjacent to each other via the element separating oxidized film 142, as shown in FIG. 4, is considered. In such an arrangement, the electrons diffused to the right in FIG. 4 are flown into the photodiode 101a, thereby generating the blooming. To the contrary, in the image pickup device according to the illustrated embodiment, as shown in FIG. 3, since the N type diffusion region 130 acts as the trapping region for trapping the over flow carriers, the blooming is reduced.

Similar to the N type diffusion region 130 as the drain region of the amplifying MOSFET 104, a drain region 134 of the reset MOSFET 103 connected to the power source, a diffusion region 135 connected to the vertical output line 106 and a floating diffusion region 132 act as trapping regions for trapping the electrons. Incidentally, since the floating diffusion region 132 is connected to the power source during the accumulating operation of the photodiode as will be described later, it may act as the trapping region for trapping the electrons. Similarly, since the diffusion region 135 connected to the vertical output line 106 can easily be maintained to potential greater than 0 V by holding a row election pulse PSEL of one row to a high level during the accumulation, it may also act as the trapping region for trapping the electrons.

The above-mentioned electron trapping regions are disposed to surround four sides of the photodiode 101b. That is to say, the drain region 134 of the reset MOSFET 103 connected to the power source (VDD) is disposed on an upper side of the photodiode 101b in FIG. 1. The N type impurity region 130 as the drain region of the amplifying MOSFET 104 connected to the power source (VDD) and the diffusion region 135 connected to the vertical output line 106 are disposed on a lower side of the photodiode. The floating diffusion regions 132 are disposed on the left and right sides of the photodiode, respectively. Thus, between the photodiode 101b and photodiodes disposed adjacent to the photodiode 101b at four sides thereof, the blooming is reduced. The similar effect can be obtained at and around the photodiode 101a.

As shown in FIG. 2, the photodiode 101a is disposed in an odd row and the photodiode 101b is disposed in an even row and, by repeating this, an area sensor is formed. The transfer MOSFET 102a is driven by a transfer pulse PTX1 and the transfer MOSFET 102b is driven by a transfer pulse PTX2. The common reset MOSFET 103 is driven by a reset pulse PRES. Further, the common row election MOSFET 105 is driven by a row election pulse PSEL.

Figure 5:
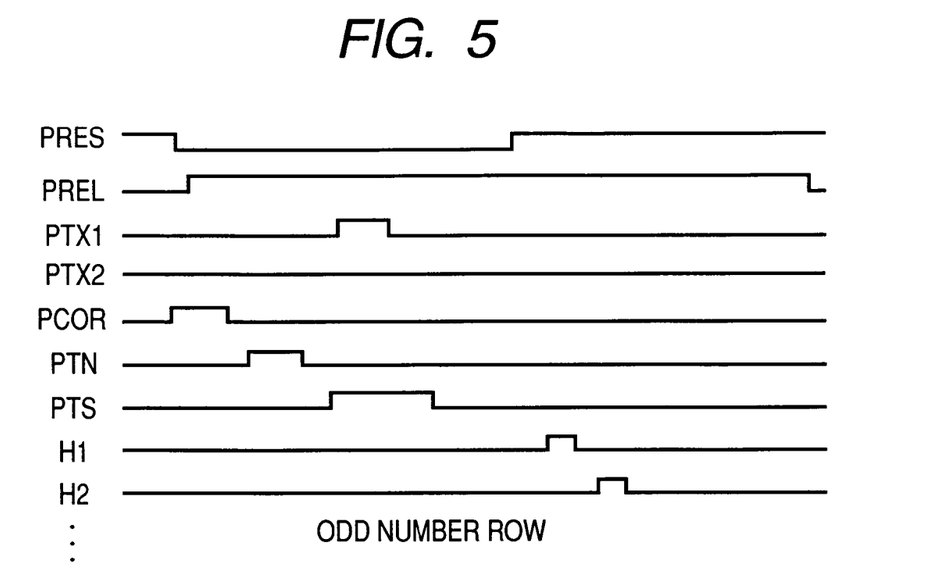
FIG. 5 is a drive pulse timing chart in the image pickup device according to the first embodiment of the present invention.
Figure 6:
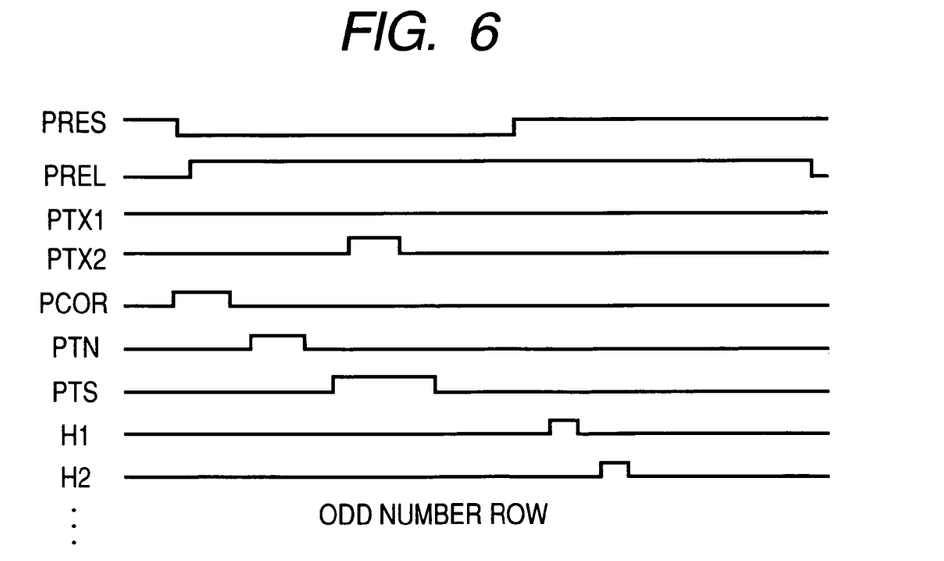
FIG. 6 is a drive pulse timing chart in the image pickup device according to the first embodiment of the present invention.

Next, an operation of the image pickup device will be explained with reference to drive pulse timing charts in FIGS. 5 and 6. Prior to a reading-out operation, it is assumed that a predetermined exposure time is elapsed so that photocarriers are accumulated in the photodiodes 101a and 101b. As shown in FIG. 5, regarding a row elected by a vertical scanning circuit 123, first of all, the pixel reset pulse PRES is changed from a high level to a low level, thereby releasing the reset of the gate electrode of the amplifying MOSFET 104. In this case, voltage corresponding to "dark" is preserved in the capacity (referred to as "Cfd" hereinafter) of the floating diffusion region connected to the gate electrode. Then, if the row election pulse PSEL is changed to the high level, a dark output appears on the vertical output line 106. In this case, an arithmetic operation amplifier 120 is in a voltage follower condition and, thus, an output of the arithmetic operation amplifier 120 is approximately equal to reference voltage VREF. After a predetermined time is elapsed, a clamp pulse PCOR is changed from a high level to a low level, thereby clamping the dark output on the vertical output line 106.

Then, a pulse PTN is changed to a high level to switch a transfer gate 110a ON, with the result that the dark signal is stored in a holding capacity 112a to include offset of the arithmetic operation amplifier 120. Thereafter, by the transfer pulse PTX1, the pixel transfer MOSFET 102a is maintained to the high level for a predetermined time period, during which the photocarriers accumulated in the photodiode 101a are transferred to the gate electrode of the amplifying MOSFET 104. On the other hand, the photocarriers in the photodiode 101b maintained to the low level are waiting in the preserved condition. Here, the transferred carriers are electrons and, when it is assumed that an absolute value of the transferred carrier amount is Q, the gate potential is decreased by Q/Cfd. In correspondence to this, a bright output appears on the vertical output line 106. When it is assumed that source follower gain is Gsf, a variation amount $\Delta Vvl$ of vertical output line potential Vvl from the dark output can be represented by the following equation 1:

$$\Delta Vvl = -(Q/Cfd) \cdot Gsf.$$

This potential variation is amplified by a reverse amplifying circuit constituted by the arithmetic operation amplifier 120, a clamp capacity 108 and a return capacity 121, and an output Vct is represented by the following equation, in combination with the above equation 1:

$$Vct = VREF + (Q/Cfd) \cdot Gsf \cdot (C0/Cf)$$

Where, C0 is the clamp capacity and Cf is the return capacity. The output Vct is stored in the other holding capacity 112b during when the pulse PTS is in the high level and the transfer gate 110b is turned ON. Thereafter, horizontal transfer switches 114b and 114a are successively elected by scanning pulses H1, H2 ... generated by a horizontal shift resistor 119 and, after the signals held in the accumulating capacities 112b and 112a are read out onto horizontal output lines 116b and 116a, they are inputted to an output amplifier 118 to be outputted in a differential manner. At this point, the reading of one row among the odd rows in which the photodiodes 101a are disposed is completed.

Then, regarding the photodiode 101b in the even row, the reading operation substantially similar to that for the odd row is repeated. As shown in FIG. 6, the difference with respect to the odd row is that, in place of the transfer pulse PTX1, the transfer pulse PTX2 is changed to the high level to switch the pixel transfer MOSFET 102b ON. At a time when the reading of the photocarriers of the photodiode 101b disposed in the even row is completed, the pixel output for two rows has been read and, by repeating such operation for the entire image, one image is outputted.

As mentioned above, in the image pickup device according to the illustrated embodiment, since the occurrence of the blooming can be reduced, the resolving power is not deteriorated and minute pixel arrangement can be realized in the common transistor design. Due to both effects, a highly fine image can be obtained.

Second Embodiment

Figure 7:
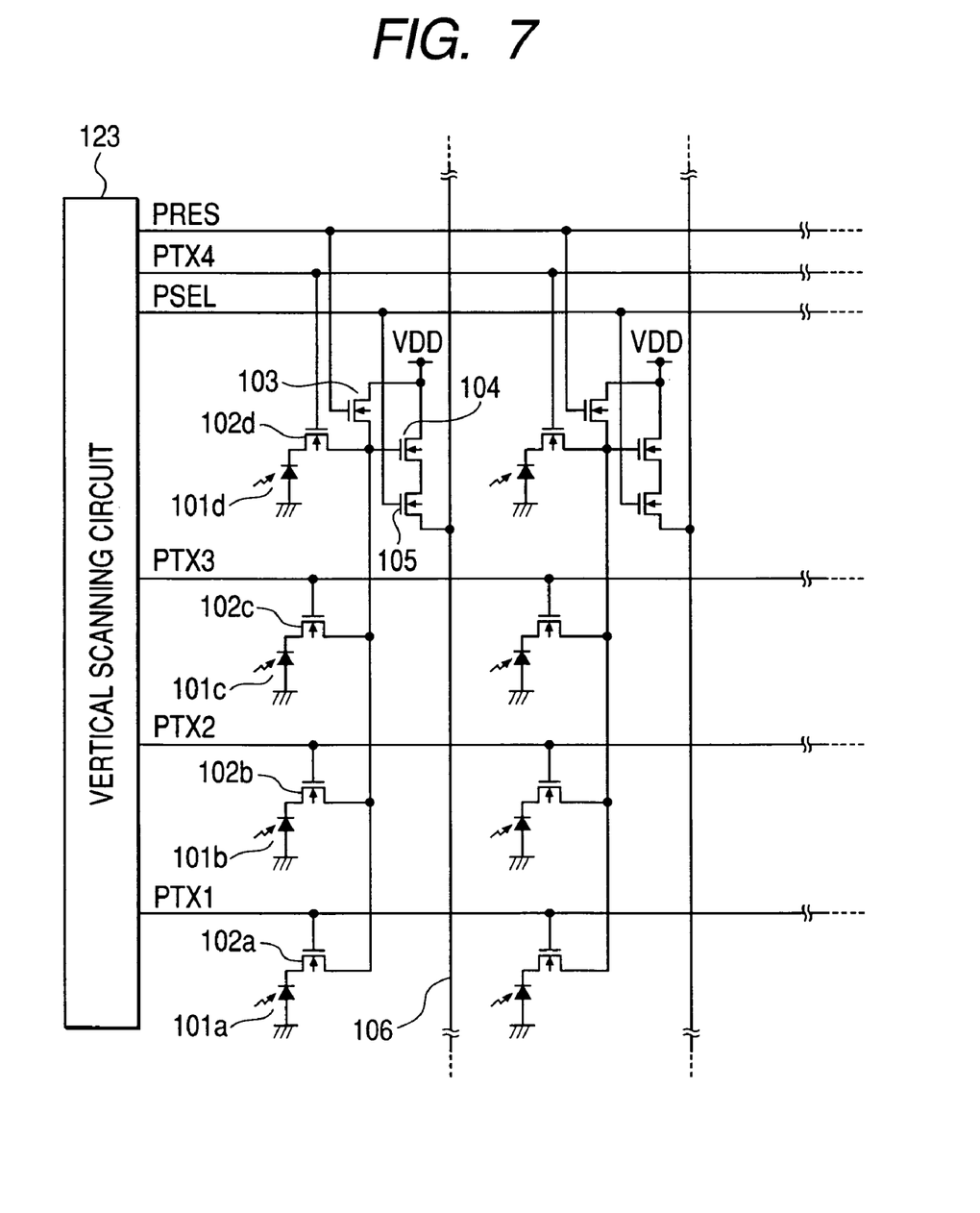
FIG. 7 is a view showing an equivalent circuit of an image pickup device according to a second embodiment of the present invention.
Figure 8:
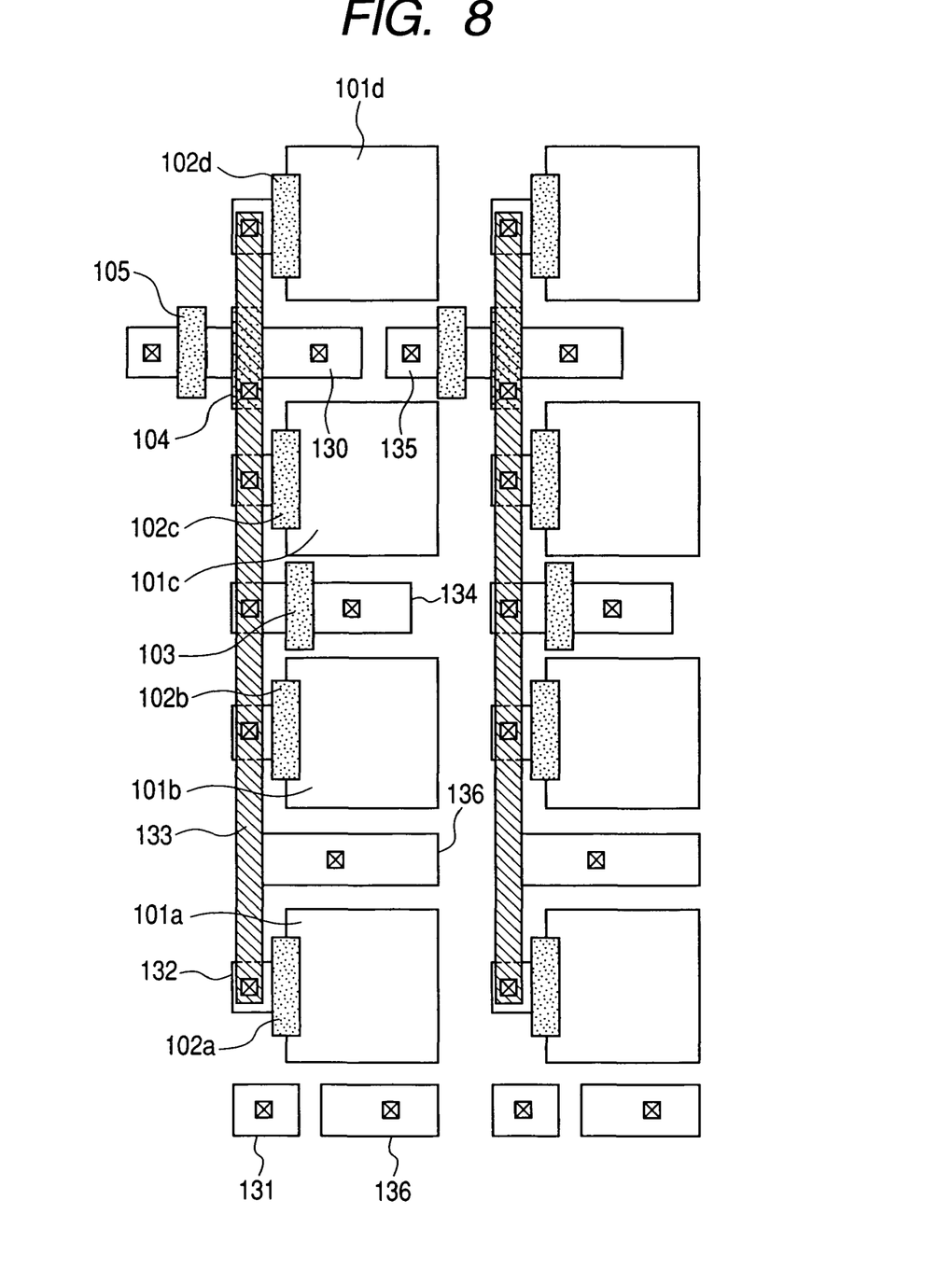
FIG. 8 is a plan view showing a layout of unit cells in the image pickup device according to the second embodiment of the present invention.

Next, an image pickup device according to a second embodiment of the present invention will be explained. FIG. 7 is a view showing an equivalent circuit of an image pickup device according to the second embodiment and illustrating a part relating to 2×4 pixels among pixels arranged in a two-dimensional pattern. In the image pickup device according to the second embodiment, four pixels hold the amplifying MOSFET, reset MOSFET and row election MOSFET in common, thereby constituting a unit cell. FIG. 8 is a plan view showing a layout of these pixels. In FIGS. 7 and 8, constructional members same as those in FIGS. 2 and 1 are designated by the same reference numerals and duplicated explanation will be omitted. Although a configuration of a gate electrode of a transfer MOSFET of FIG. 8 is different from the gate electrode of the pixel transfer MOSFET of FIG. 1 apparently, such difference is generated by simplifying the Figure and the actual configuration of the gate electrode of the transfer MOSFET is the same as the configuration of the gate electrode of the transfer MOSFET of FIG. 1 (this is also true in third and fourth embodiments).

In FIG. 8, the reference numerals 101a-101d designate an N type diffusion region of a photodiode provided in a P well (a PN junction is constituted by the P well and the N type diffusion region); 102a-102d designate a gate electrode of a transfer MOSFET; and 136 designates an electron trapping N type diffusion region connected to a power source.

Four pixels hold a reset MOSFET 103, an amplifying MOSFET 104 and a row election MOSFET 105 in common and the photodiodes 101a, 101b, 101c and 101d are disposed in 4n-3, 4n-2, 4n-1 and 4n rows, respectively (here, n is the natural number). The transfer MOSFETs 102a, 102b, 102c and 102d are disposed in correspondence to the photodiodes 101a, 101b, 101c and 101d, respectively. As a result, the number of the transistors in the unit cell is seven and the number of transistors per one pixel becomes 1.75, which is advantageous for the reduction of the pixel. Similar to the image pickup device of the first embodiment, a drain region 130 of the amplifying MOSFET 104 connected to the power source, a drain region 134 of the reset switch 103 connected to the power source, a diffusion region 135 connected to a vertical output line 106 and a floating diffusion region 132 act as trapping regions for trapping electrons. Further, in this embodiment, in portions in which any transistor is not disposed, electron trapping N type diffusion regions connected to the power source such as a diffusion region 136 are provided. As is in the illustrated embodiment, in a common transistor arrangement, having four or more pixels, in which the number of transistors per one pixel is very small, it is advantageous that the N type diffusion region 136 is provided to prevent the blooming. In an image pickup device in which sides (upper, lower, left and right sides) of the photodiodes are not surrounded by the electron trapping regions, the blooming was generated. However, in the image pickup device according to the illustrated embodiment, the blooming can be reduced.

Third Embodiment

Figure 9:
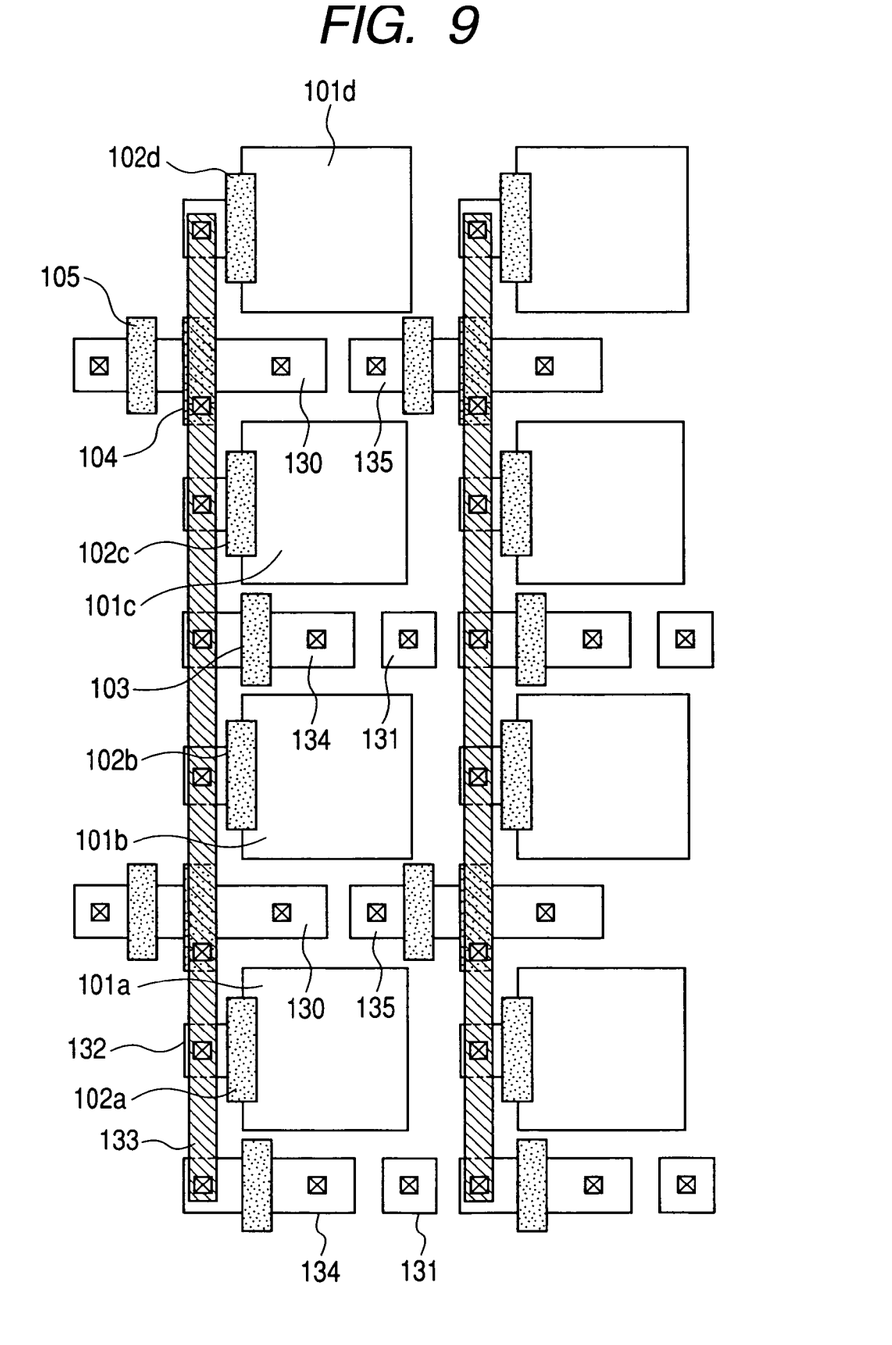
FIG. 9 is a plan view showing a layout of unit cells in an image pickup device according to a third embodiment of the present invention.

Next, an image pickup device according to a third embodiment of the present invention will be explained. An equivalent circuit of the image pickup device according to the third embodiment is similar to that in the second embodiment. FIG. 9 is a plan view showing a layout of pixels. In FIG. 9, constructional members same as those in FIG. 8 are designated by the same reference numerals and duplicated explanation will be omitted. Four pixels hold a reset MOSFET 103, an amplifying MOSFET 104 and a row election MOSFET 105 in common and the photodiodes 101a, 101b, 101c and 101d are disposed in 4n-3, 4n-2, 4n-1 and 4n rows, respectively (here, n is the natural number). The transfer MOSFETs 102a, 102b, 102c and 102d are disposed in correspondence to the photodiodes 101a, 101b, 101c and 101d, respectively. Similar to the image pickup device of the second embodiment, a drain region 130 of the amplifying MOSFET 104 connected to the power source, a drain region 134 of the reset switch 103 connected to the power source, a diffusion region 135 connected to a vertical output line 106 and a floating diffusion region 132 act as trapping regions for trapping electrons.

Figure 10:
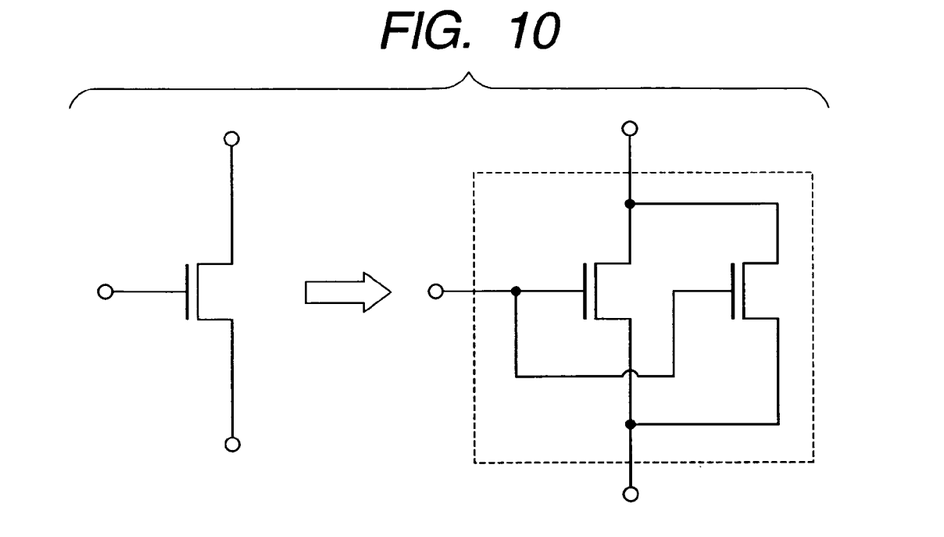
FIG. 10 is a view showing transistors of insulation gate type connected in parallel.

Further, the characteristic of the image pickup device according to the illustrated embodiment is that each of the reset MOSFET 103, amplifying MOSFET 104 and row election MOSFET 105 has substantially two-times gate width in which two MOSFETs as a unit element are connected in parallel as shown in FIG. 10. With this arrangement, a minimum dimension of the transistor is limited, so that the reduction of the pixel is more disadvantageous than the image pickup device of the second embodiment. However, since a driving force of the MOSFET is increased, the reading-out of the pixel can be performed more quickly. Similar to the image pickup device of the second embodiment, also in the image pickup device according to the third embodiment, the occurrence of the blooming can be reduced.

Gate electrodes of two reset switches 103 and of two row election switches 105 are connected to a common drive line, respectively.

Fourth Embodiment

Figure 11:
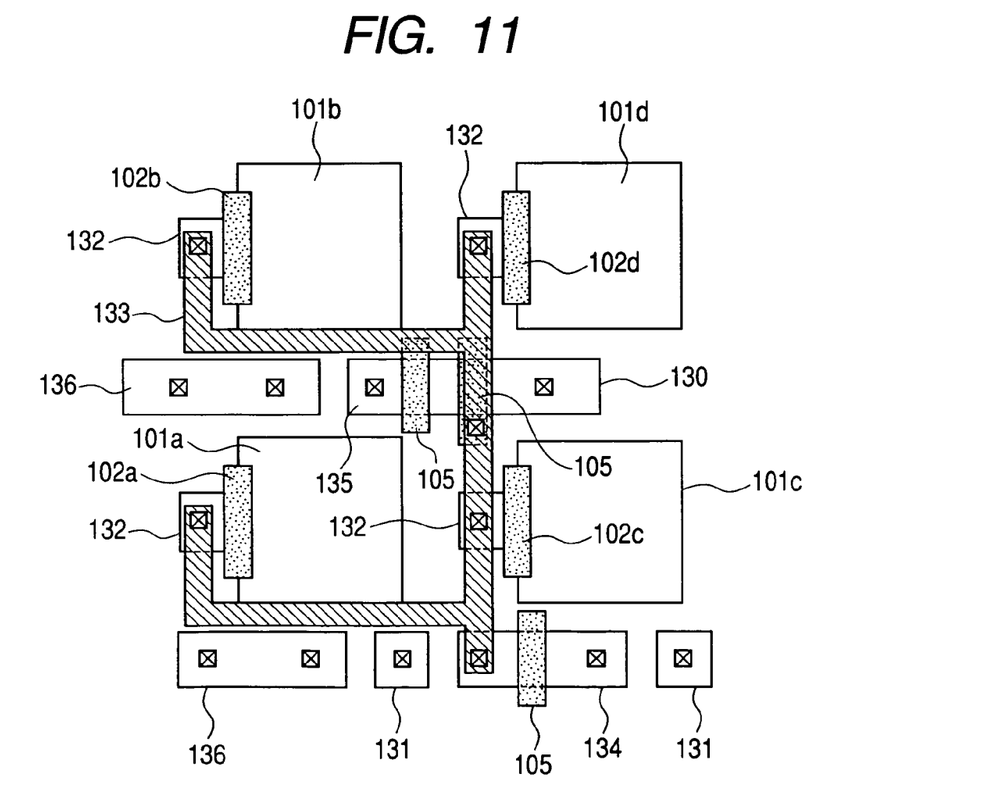
FIG. 11 is a plan view showing a layout of unit cells in an image pickup device according to a fourth embodiment of the present invention.
Figure 12:
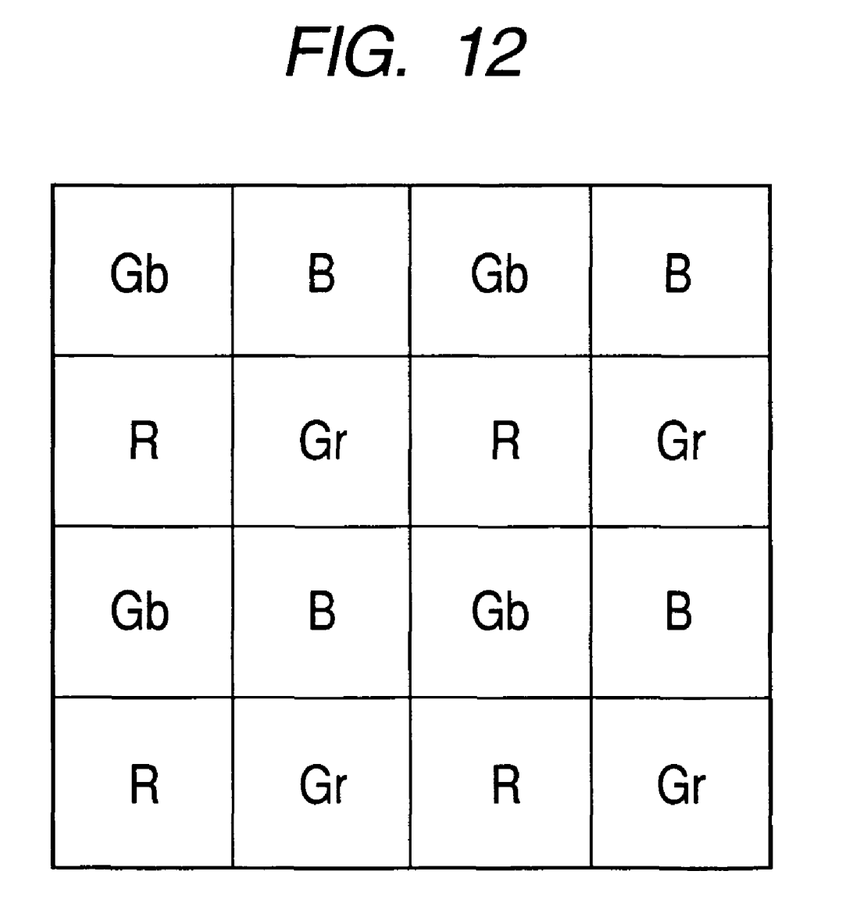
FIG. 12 is a plan view showing a color filter arrangement of the image pickup device according to the fourth embodiment of the present invention.

Next, an image pickup device according to a fourth embodiment of the present invention will be explained. An equivalent circuit of the image pickup device of the fourth embodiment is similar to that of the third embodiment. FIG. 11 is a plan view showing a layout of pixels. In FIG. 11, constructional members same as those in FIG. 8 are designated by the same reference numerals and duplicated explanation will be omitted. Four pixels hold a reset MOSFET 103, an amplifying MOSFET 104 and a row election MOSFET 105 in common and the photodiodes 101a, 101b, 101c and 101d are arranged so that a unit cell is constituted by a 2×2 rectangle. Green filters shown in FIG. 12 coincide with a color filter construction having a Bayer color array as a checkered pattern. In FIG. 12, Gb and Gr show green filters, B shows a blue filter and R shows a red filter. From this, even if the capacity 132 formed by the floating diffusion regions commonly connected by the four pixels is varied with each unit pixel group or even if amplifying gain of the common amplifying MOSFET is varied with each pixel group, since the gain in picture pixel is varied at the same ratio, the color ratio is not changed in the picture pixel. Similar to the image pickup device of the second embodiment, the drain electrode 130 of the amplifying MOSFET 104 connected to the power source, the drain electrode 134 of the reset switch 103 connected to the power source, the diffusion region 135 connected to the vertical output line 106 and the floating diffusion region 132 act as the trapping regions for trapping the electrons. Further, regarding an area in which no transistor is provided, an electron trapping N type diffusion region 136 connected to the power source is provided. With this arrangement, in the image pickup device according to the illustrated embodiment, the occurrence of the blooming can be reduced. Particularly, for example, if blue light having high transmittance to the B (blue) filter is incident, in an image pickup device in which the electron trapping region is not provided between the photodiode 101d and the photodiodes 101b and 101c, the electrons diffused from the photodiode 101d corresponding to B (blue) flow into the adjacent photodiodes 101b and 101c. As a result, a G (green) output is floated off, so that colors cannot be reproduced correctly. However, in the illustrated embodiment, an image pickup device having excellent color reproduction can be obtained.

In the above-mentioned embodiments, while the construction in which each photoelectric conversion region has a square shape and one or more electron trapping regions are provided at four sides of the square shape was explained, the shape of the photoelectric conversion region is not necessarily limited to the square shape. The technical concept of the present invention is that the trapping regions for trapping the over flow carriers are provided between one photoelectric conversion region and plural photoelectric conversion regions disposed adjacent to and around the one photoelectric conversion region, and, thus, the shape of the photoelectric conversion region is not limited particularly. For example, even in a case of a photoelectric conversion region having a shape such as a hexagon or an octagon other than the square, the number of trapping regions corresponding to the number of adjacent photoelectric conversion regions may be provided. For example, in a case where the shape of each photoelectric conversion region is octagon for example, if eight photoelectric conversion regions are not disposed adjacent to eight sides of the octagon completely but four photoelectric conversion regions are disposed in row and column directions, respectively or if eight photoelectric conversion regions are disposed adjacent to eight sides of the octagon but they are not equidistant so that substantially only four photoelectric conversion regions are disposed adjacent to the sides to arise the blooming problem, the trapping regions may be provided between the four photoelectric conversion regions and the associated sides.

Further, in the above-mentioned embodiments, while an example that the electron trapping regions are provided between the one photoelectric conversion region and the photoelectric conversion regions arranged in the row and column direction was explained, further, in order to prevent the blooming between the one photoelectric conversion region and the photoelectric conversion regions arranged in oblique directions, electron trapping regions may be added between the one photoelectric conversion region and the photoelectric conversion regions arranged in the oblique directions or the electron trapping regions provided between the one photoelectric conversion region and the photoelectric conversion regions arranged in the row and column directions can be extended. Further, the trapping regions may be in common with each other; for example, the trapping region provided between the upper side and the associated photoelectric conversion region may be connected to the trapping region provided between the left side and the associated photoelectric conversion region to be in common with each other.

Further, there are various layouts of the drain region 130 of the amplifying MOSFET 104 connected to the power source, the drain region 134 of the reset switch 103 connected to the power source, the diffusion region 135 connected to the vertical output line 106 and the floating diffusion region 132, which act as the electron trapping regions and, thus, the layouts therefore are not limited to the above-mentioned layouts. Further, regarding the conductive type, although the conductive type same as the signal carrier is preferable, a conductive type opposite to the signal carrier can also be used as the trapping region, so long as it has impurity density smaller than the neighborhood.

Further, in the above-mentioned embodiments, while the arrangement in which one election MOSFET is provided in correspondence to each common amplifying MOSFET was explained, this election MOSFET may be omitted. In this case, the pixel can be selected by controlling potential of the FD region by means of the reset MOSFET and the like.

Fifth Embodiment

Figure 13:
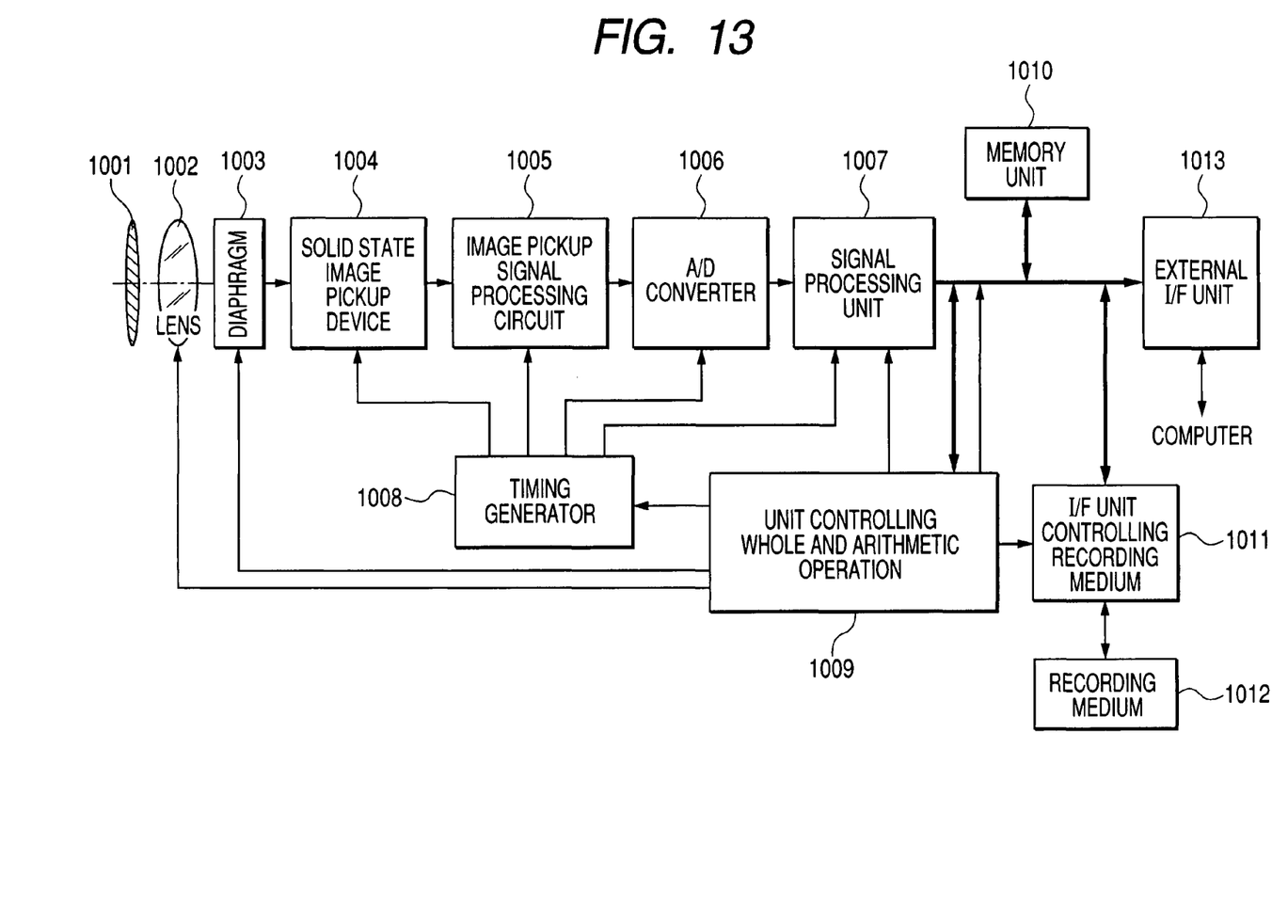
FIG. 13 is a conceptual view showing an image pickup system according to a fifth embodiment of the present invention.

FIG. 13 is constructional view of an image pickup system utilizing the image pickup device according to any one of the above-mentioned embodiments.

The image pickup system is constituted by a barrier 1001 protecting a lens and also acting as a main switch, a lens 1002 for focusing an optical image of an object onto an image pickup element 1004, a diaphragm 1003 for variably changing a light amount passed through the lens 1002, the above-mentioned image pickup element 1004 (corresponding to the image pickup device explained in the above-mentioned embodiments) for taking-in the object image focused by the lens 1002 as an image signal, an image pickup signal processing circuit 1005 for performing the processing such as various corrections, clamps and the like with respect to the image signal outputted from the image pickup element 1004, an A/D converter 1006 for performing analogue/digital conversion of the image signal outputted from the image pickup element 1004, a signal processing unit 1007 for performing various corrections with respect to image data outputted from the A/D converter 1006 and for compressing the image data, and a timing generator 1008 for outputting various timing signals to the image pickup element 1004, image pickup signal processing circuit 1005, A/D converter 1006 and signal processing unit 1007. Incidentally, the circuits 1005-1008 may be formed on the same chip as the image pickup element 1004. Further, a solid image pickup system is constituted by a unit 1009 controlling whole and arithmetic operation for controlling various arithmetic operations and the whole still video camera, a memory unit 1010 for temporarily storing the image data, an I/F (interface) unit 1011 controlling recording medium for performing recording or reading-out with respect to a recording medium, a removable recording medium 1012 such as a semiconductor memory and the like for recording or reading the image data, and an external interface (I/F) unit 1013 for communicating with an external computer and the like, in addition to the above-mentioned various elements and circuits.

Next, an operation of the system shown in FIG. 13 will be explained. When the barrier 1001 is opened, the main power source is turned ON and then a power source of the control system is turned ON and further power sources for the circuits associated with the image pickup are turned ON. Then, in order to control an exposure amount, the unit 1009 controlling whole and arithmetic operation opens the diaphragm 1003, with the result that the signal outputted from the image pickup element 1004 passes through the image pickup signal processing circuit 1005 and is outputted to the A/D converter 1006. The A/D converter 1006 A/D-converts the signal and outputs the converted signal to the signal processing unit 1007. The signal processing unit 1007 performs an arithmetic operation of the exposure on the basis of the data at the unit 1009 controlling whole and arithmetic operation.

Then, the brightness is judged on the basis of the result of the photometry and the unit 1009 controlling whole and arithmetic operation controls the diaphragm in accordance with such result. Then, on the basis of the signal outputted from the solid image pickup element 1004, at the unit 1009 controlling whole and arithmetic operation, a high frequency component is picked up and a distance up to the object is calculated. Thereafter, by driving the lens 1002, it is judged whether the focusing is achieved or not. If it is judged that the focusing is not achieved, the lens 1002 is driven again to perform photometry.

After the focusing is ascertained, the exposure is started. When the exposure is finished, the image signal outputted from the solid image pickup element 1004 is corrected in the image pickup signal processing circuit 1005 and then is A/D-converted in the A/D converter 1006 and then passes through the signal processing unit 1007 and is accumulated in the memory unit 1010 by the unit 1009 controlling whole and arithmetic operation. Thereafter, the data accumulated in the memory unit 1010 passes through the I/F unit 1011 controlling recording medium and is recorded on the removable recording medium 1012 such as the semiconductor memory, under the control of the unit 1009 controlling whole and arithmetic operation. Further, the data may be inputted to a computer and the like directly through the external I/F unit 1013 to work the image.

The present invention can be applied to a solid image pickup device used in a solid image pickup system such as a scanner, a video camera, a digital still camera and the like.

This application claims priority from Japanese Patent Application No. 2004-254357 filed on Sep. 1, 2004, which is hereby incorporated by reference herein.

What is claimed is:

1. An image pickup device comprising unit cells arranged two-dimensionally,
    wherein each of said unit cells includes:
        a plurality of photoelectric conversion regions;
        a plurality of floating diffusion regions;
        a plurality of transfer switches provided in correspondence to said photoelectric conversion regions, respectively;
        a common amplifying transistor for amplifying a signal corresponding to photocarriers transferred from said photoelectric conversion regions as an input of said common amplifying transistor; and
        a common reset transistor,
    wherein plural photoelectric conversion regions are disposed adjacent to and around one photoelectric conversion region,
    wherein semiconductor regions trapping overflowed carriers from said one photoelectric conversion region are arranged such that each semiconductor region is provided between said one photoelectric conversion region and a corresponding one of said plural photoelectric conversion regions, respectively, and
    wherein said semiconductor regions are formed of any combination of said floating diffusion regions and source regions and drain regions of said common amplifying transistor and said common reset transistor.

2. An image pickup device according to claim 1, wherein said common reset transistor resets said input of said common amplifying transistor.

3. An image pickup device according to claim 1, wherein each of said unit cells includes a selection switch for performing selection and non-selection of an output of said common amplifying transistor.

4. An image pickup device according to claim 1, regions included in a same unit cell are connected to each other via an electroconductor.

5. An image pickup device according to claim 1, wherein said common amplifying transistor is arranged as a single unit by connecting a plurality of elements in parallel.

6. An image pickup device according to claim 2, wherein said reset transistor is arranged as a single unit by connecting a plurality of elements in parallel.

7. An image pickup device according to claim 3, wherein said selection switch is arranged as a single unit by connecting a plurality of elements in parallel.

8. An image pickup device according to claim 1, wherein each of said semiconductor regions includes an impurity diffusion region of a same conductive type as said photocarriers.

9. An image pickup device according to claim 8, wherein said impurity diffusion region is set to a predetermined potential.

10. An image pickup device according to claim 1, wherein said image pickup device is incorporated in an image pickup system that includes:
    an optical system for focusing light onto said image pickup device; and
    a signal processing circuit for processing an output signal from said image pickup device.

11. The image pickup device according to claim 1, wherein said floating diffusion regions are set to a predetermined potential while said photoelectric conversion regions are accumulating photocarriers.

* * * * *